(12) United States Patent
Choi et al.

(10) Patent No.: US 11,340,530 B2
(45) Date of Patent: May 24, 2022

(54) IMPLANTING METHOD AND APPARATUS

(71) Applicant: XIA TAI XIN SEMICONDUCTOR (QING DAO) LTD., Qingdao (CN)

(72) Inventors: Jong-Moo Choi, Singapore (SG); Sung-Ki Kim, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 54 days.

(21) Appl. No.: 16/679,315

(22) Filed: Nov. 11, 2019

(65) Prior Publication Data

US 2020/0218156 A1    Jul. 9, 2020

Related U.S. Application Data

(60) Provisional application No. 62/779,520, filed on Dec. 14, 2018.

(51) Int. Cl.
| | |
|---|---|
| *G03F 7/30* | (2006.01) |
| *H01L 21/425* | (2006.01) |
| *H01L 21/308* | (2006.01) |
| *G03F 7/20* | (2006.01) |

(52) U.S. Cl.
CPC ........ *G03F 7/3021* (2013.01); *H01L 21/3086* (2013.01); *H01L 21/425* (2013.01); *G03F 7/2063* (2013.01)

(58) Field of Classification Search
CPC . G03F 7/3021; G03F 7/2063; H01L 21/0386; H01L 21/425
See application file for complete search history.

(56) References Cited

U.S. PATENT DOCUMENTS

| | | | | |
|---|---|---|---|---|
| 8,552,299 B2* | 10/2013 | Rogers | .................... | H01L 25/50 174/254 |
| 2004/0004713 A1* | 1/2004 | Go | .................... | H01L 21/67046 356/237.1 |

* cited by examiner

*Primary Examiner* — Seahvosh Nikmanesh
(74) *Attorney, Agent, or Firm* — ScienBiziP, P.C.

(57) ABSTRACT

The instant disclosure includes an implanting apparatus and a method thereof. The implanting apparatus has a chuck configured to carry a substrate is rotated a number of times at an angle during ion implantation. In this way, masks used during semiconductor fabrication is reduced.

16 Claims, 4 Drawing Sheets

IMPLANTING METHOD AND APPARATUS

CROSS-REFERENCES TO RELATED APPLICATIONS

This application claims the benefit of U.S. Provisional Patent Application No. 62779520 filed on Dec. 14, 2018, which is hereby incorporated by reference herein and made a part of specification.

BACKGROUND

1. Field

The present disclosure generally relates to implanting method and apparatus, and more particularly, implanting method and apparatus for rotating substrate to eliminate masking processes.

2. Related Art

In order to provide analog field effect transistor (FET) and digital FET doping profiles that are independent of one another, one must selectively cover (typically with photoresist) the first set of devices, e.g. the analog FETs, while performing extension and halo ion implantations for the second set, e.g. the digital FETs, and then, remove the covering resist, cover the second set of devices, e.g. the digital FETs, selectively, and perform the extension and halo ion implantations for the first set of devices. This is an expensive and time-consuming process.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
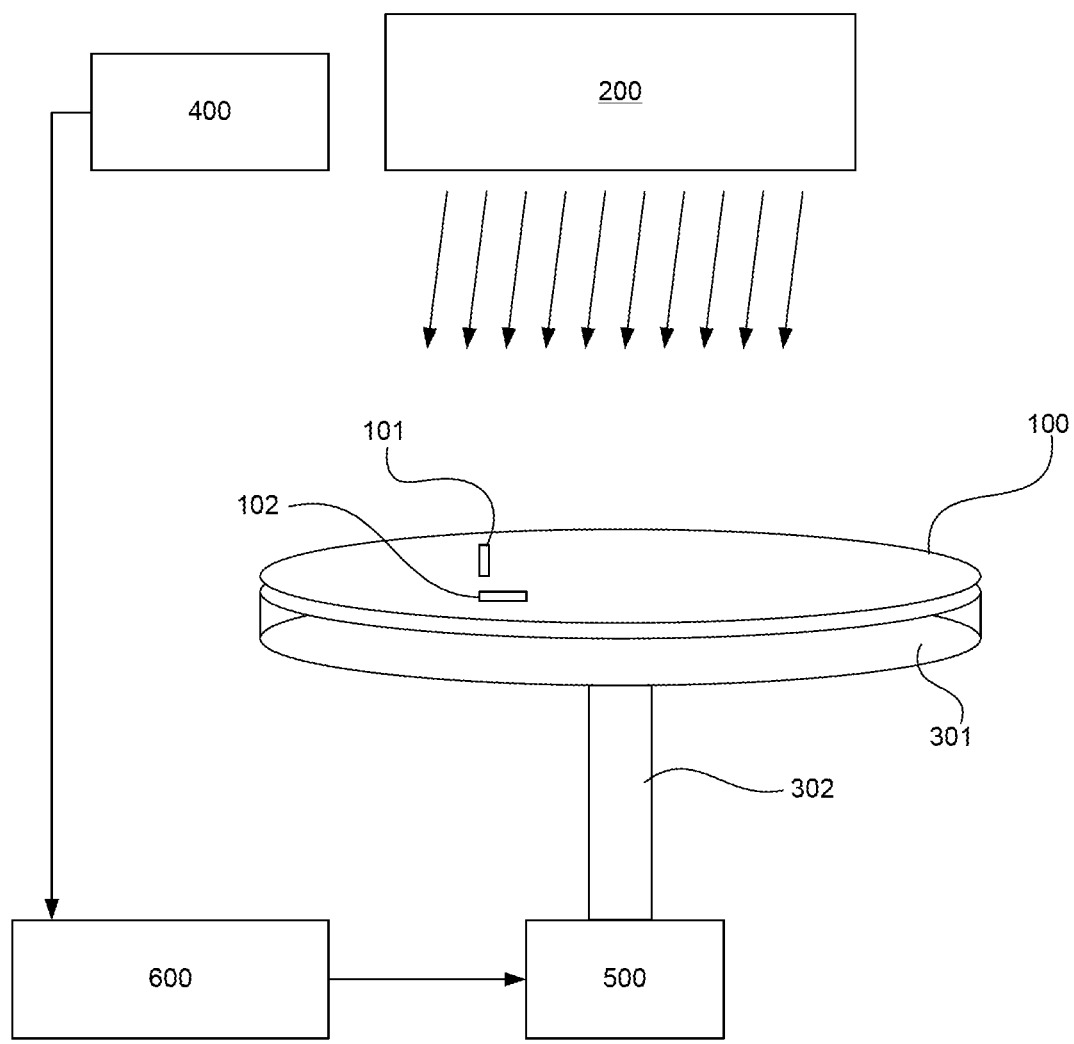
FIG.1 illustrates an ion implantation apparatus according to some embodiments of the instant disclosure.

The present disclosure will now be described more fully hereinafter with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG.1 illustrates an ion implantation apparatus according to some embodiments of the instant disclosure. The ion implantation apparatus is used for implanting ions on a substrate 100 having a first transistor 101 and a second transistor 102 orthogonally arranged (e.g., the channel direction/ gate line direction of the first transistor 101 being perpendicular with respect to the channel direction/ gate line direction of the second transistor 102) from the first transistor 101. The ion implantation apparatus includes an ion source 200, a chuck positioned to face the ion source 200, the chuck having a plate 301 where the substrate is disposed on and a shaft 302 coupled to a center portion of the plate 301; an analyzer 400 positioned to face the substrate 100 and outputs a rotational displacement of the substrate 100 with respect to the plate 301 of the chuck, and a stepper motor 500 mechanically coupled to the shaft of the chuck to rotate the substrate 100. In some embodiments, the ion implantation apparatus further comprises a controller 600 coupled to the analyzer 400 and the stepper motor 500. The controller 600 outputs signals to the stepper motor 500 according to an input from the analyzer 400. The input from the analyzer 400 is the rotational displacement of the substrate 100.

In some embodiments, a number of steps for the stepper motor 500 to complete a full rotation is represented as X when the rotational displacement is substantially 0 In some embodiments, the number of steps for the stepper motor to complete a full rotation is four and each step rotates at a 90° angle when the rotational displacement is substantially 0.

In some embodiments, a number of steps for the stepper motor 500 to complete a full rotation is represented as Y when the rotational displacement is greater than 0. In some embodiments, under this scenario, the number of steps for the stepper motor to complete a full rotation is eight and each step rotates at a 45° angle when the rotational displacement is greater than 0.

Figure 2:
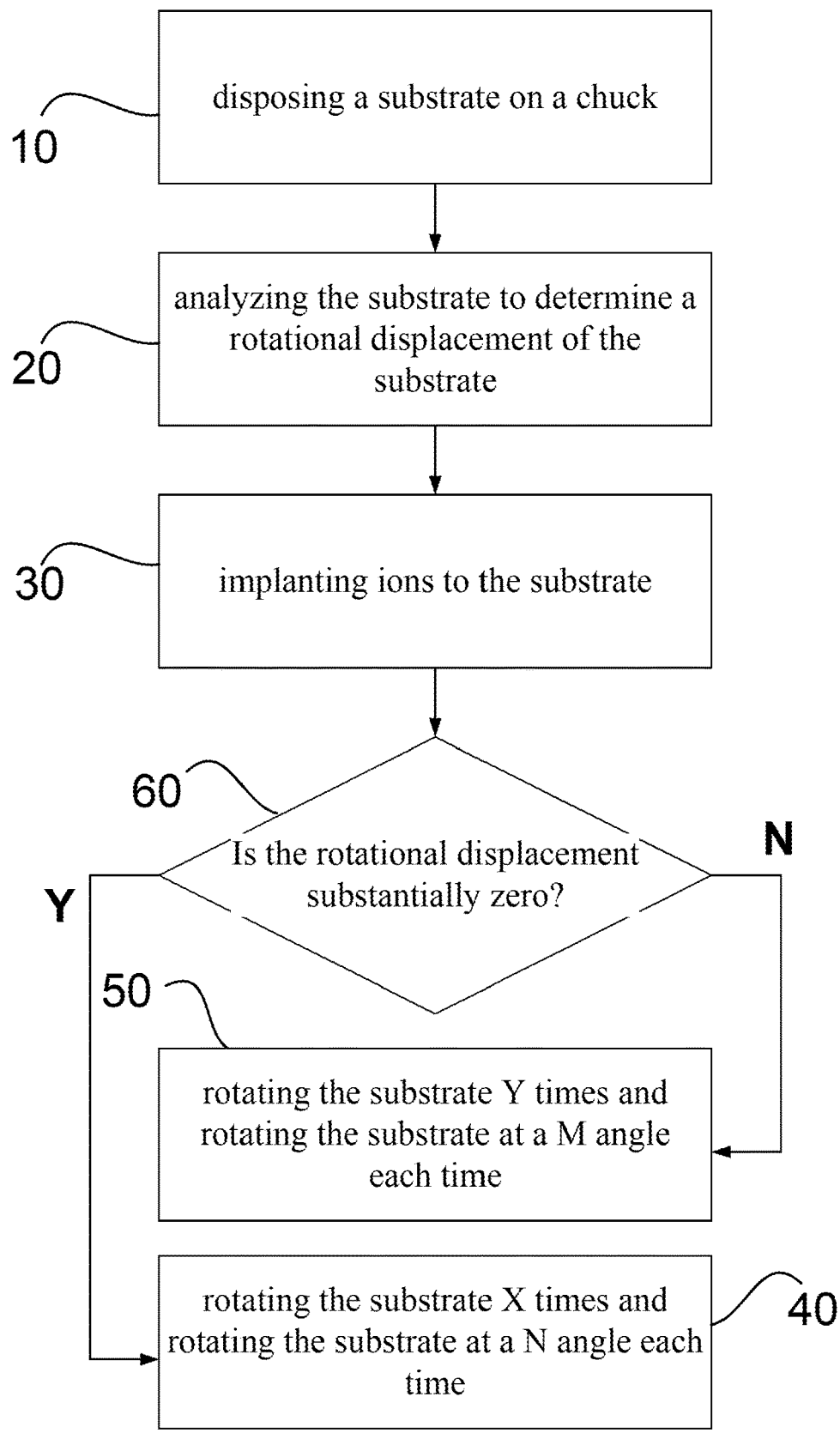
FIG.2 illustrates a flowchart of an implanting method according to some embodiments of the instant disclosure.

FIG. 2 illustrates a flowchart of an implanting method according to some embodiments of the instant disclosure. The implanting method includes disposing a substrate on a chuck (10), analyzing the substrate to determine a rotational displacement of the substrate (20), implanting ions to the substrate (30), determine if rotational displacement is substantially 0 (60), rotating the substrate X times and rotating the substrate at a N angle each time (40) when the rotational displacement is substantially 0; and rotating the substrate Y times and rotating the substrate at a M angle each time (50) when the rotational displacement is greater than 0. In some embodiments, the implanting method further comprises rotating the chuck using a stepper motor mechanically coupled to a shaft of the chuck. A full rotation of the stepper motor is divided into a number of steps. The number of steps are dependent on the rotational displacement of the substrate.

Figure 3:
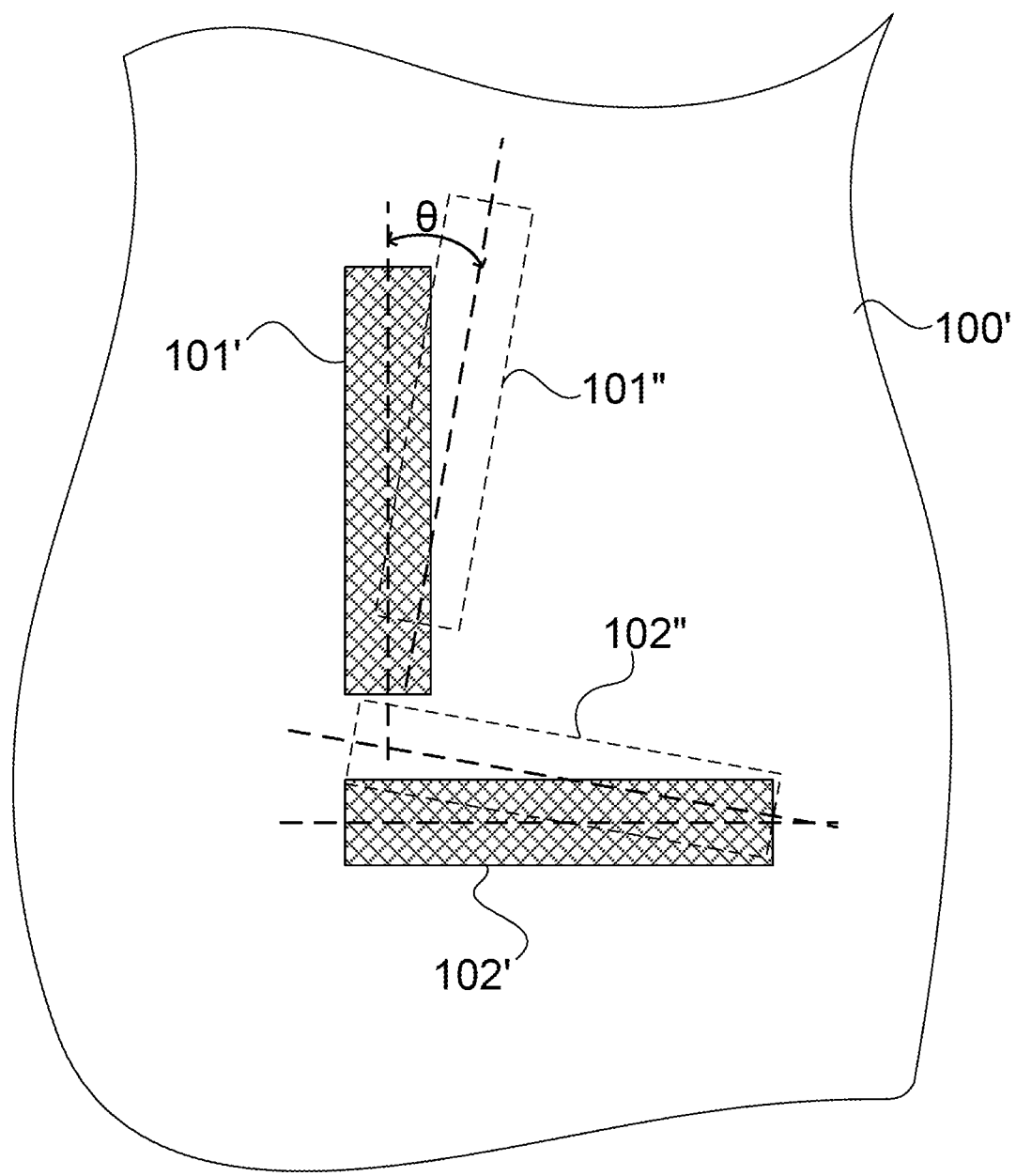
FIG.3 illustrates a top view of a substrate according to some embodiments of the instant disclosure.

The substrate provided to the chuck may include a plurality of transistors. A portion of the transistors may be used for analog circuits and another portion of the transistors may be used for digital circuits. FIG. 3 illustrates a top view of a substrate according to some embodiments of the instant disclosure. In some embodiments, the substrate 100' has a first transistor 101' and a second transistor 102' orthogonally arranged from the first transistor 101'. In some embodiments, the first transistor 101' is a transistor for analog circuit and a second transistor 102' is for digital circuit. The embodiments are not limited thereto. In some other embodiments, the first transistor 101' is a transistor for digital circuit and a second transistor 102' is for analog circuit.

When disposing the substrate 100' onto the chuck, a rotational displacement θ occurs. When the rotational displacement θ is 0, the substrate may be perfectly placed onto the chuck. When the rotational displacement θ is greater than 0, the substrate may not be properly placed on the chuck. The substrate may be misaligned with respect to the ion source. In some embodiments, the rotational displacement θ is determined by the analyzer. The analyzer may use image processing to determine the rotational displacement θ. The analyzer may have an image of the substrate when properly placed stored in a memory. And, the analyzer may use the stored image to compare with image of the substrate 100' to determine rotational displacement θ.

As shown in FIG. 3, the outlines 101" and 102" is an example on displacement that may occur when placing the substrate on the chuck. The outline 101" may be the position of the first transistor 101' when a rotational displacement θ occurs. The outline 102" may be the position of the second transistor 102' when a rotational displacement θ occurs. The rotational displacement θ is measured as an angle displacement between the center line of a first transistor 101' when the substrate is properly placed on the chuck and the center line of outline 101" when the substrate is misaligned on the chuck.

When the rotational displacement is substantially 0, the substrate is rotated X times and the substrate is rotated at a N angle each time. In some embodiments, the X times is 4 times and N angle is 90°.

When the rotational displacement is greater than 0, the substrate is rotated Y times and the substrate is rotated at a M angle each time. In some embodiments, the Y times is 8 times and the M angle is 45°. In some embodiments, the Y times is greater than 4 times. In some embodiments, the Y times is dependent on the value of the M angle. The Y times may be the number of times the substrate is rotated to achieve a 360° rotation using M angle at each rotation. In some embodiments, the M angle is less than 45°. In some embodiments, the M angle is about 30°. In some embodiments, the M angle is about 20°. A smaller M angle may result to a more uniform doping region around the gate of a transistor regardless of being used for analog circuit or digital circuit.

Figure 4:
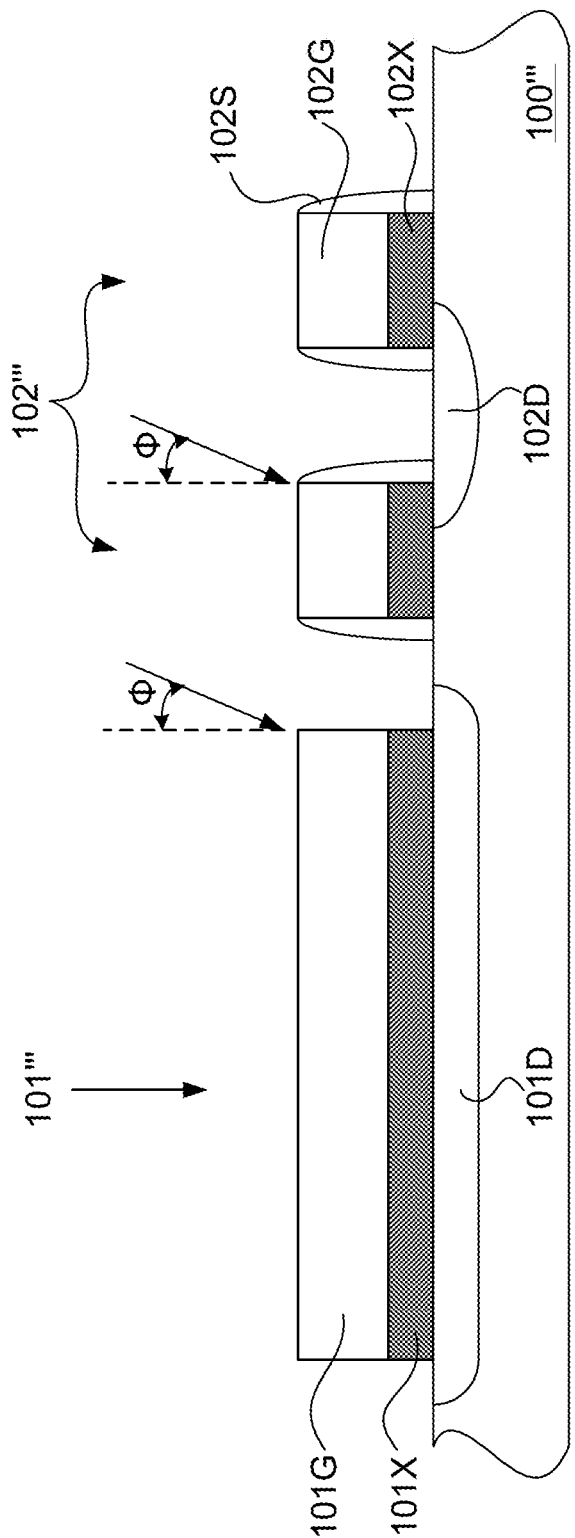
FIG.4 illustrates a cross sectional view of a substrate according to some embodiments of the instant disclosure.

In some embodiments, the ion source generates and delivers ions to the substrate. FIG. 4 illustrates a cross sectional view of a substrate 100''' according to some embodiments of the instant disclosure. The substrate 100''' includes a first transistor 101''' and a second transistor 102'''. The first transistor 101''' includes a gate 101G disposed on the substrate 100''', an oxide layer 101X disposed on the substrate 100''', and a doped region 101D. The second transistor 102''' includes a gate 102G disposed on the substrate 100''', an oxide layer 102X disposed on the substrate 100''', and a doped region 102D. The second transistor 102''' further includes a spacer 102S disposed on sidewalls of the gate 102G and the oxide layer 102X of the second transistor 102'''. In some embodiments, the distance between gates 101G of two first transistor 101''' is greater than a distance between gates 102G of two second transistor 102'''. In some other embodiments the distance between gates 101G of two first transistor 101''' is less than a distance between gates 102G of two second transistor 102'''.

The ions from the ion source form doped regions 101D and 102D in the substrate 100'''. In some embodiments, the ions are for extension implants. The extension implants may form doped regions 101D and 102D, such as lightly doped drain (LDD) in the substrate 100'''. In some embodiments, the ions include at least one of Boron fluoride ($BF_2$) and Arsenic ions ($As^+$). In some embodiments, a dose concentration for the ions ranges from about $1E13/cm^2$ to $5E14/cm^2$. In some embodiments, an energy used for implanting the ions ranges from about 2 KeV to 10 KeV. In some embodiments, a tilting angle Φ of the ions ranges from about 0° to 10°. In some embodiments, a tilting angle Φ of the ions ranges from about 0° to 45°. In some embodiments, a tilting angle Φ of the ions ranges from about 10° to 45°. In some embodiments, a tilting angle Φ of the ions is greater than about 10°. In some embodiments, a tilting angle Φ of the ions is less than about 45°.

In some embodiments, the ions are for halo implants. The halo implants may form doped regions 101D and 102D in the substrate 100'''. In some embodiments, the ions include at least one of Arsenic ions ($As^+$) and Boron ions ($B^+$). In some embodiments, a dose concentration for the ions ranges from about $1E13/cm^2$ to $5E14/cm^2$. In some embodiments, an energy used for implanting the ions ranges from about 5 KeV to 50 KeV. In some embodiments, a tilting angle Φ of the ions ranges from about 0° to 20°. In some embodiments, a tilting angle Φ of the ions ranges from about 0° to 45°. In some embodiments, a tilting angle Φ of the ions ranges from about 20° to 45°. In some embodiments, a tilting angle Φ of the ions is greater than about 20°. In some embodiments, a tilting angle Φ of the ions is less than about 45°. In some embodiments, the substrate is rotated by rotating a chuck where the substrate is disposed on.

In some embodiments, the ions further include carbon ions ($C^+$). In some embodiments, the ions are for N-type implantation. In some embodiments, the ions are for P-type implantation.

The embodiments of the instant disclosure allow the elimination of separate masks for performing ion implantation for analog transistors and digital transistors. There is no need to cover the analog transistors when ion implantation is being performed for digital transistors. There is no need to cover the digital transistors when ion implantation is being performed for analog transistors.

Accordingly, one aspect of the instant disclosure provides an implanting method that comprises disposing a substrate on a chuck; analyzing the substrate to determine a rotational displacement of the substrate; implanting ions to the substrate; rotating the substrate X times and rotating the substrate at N angle each time when the rotational displacement is substantially 0; and rotating the substrate Y times and rotating the substrate at M angle each time when the rotational displacement is greater than 0.

In some embodiments, the substrate has a first transistor and a second transistor orthogonally arranged with respect to the first transistor.

In some embodiments, rotating the substrate X times is rotating the substrate four times and rotating the substrate at N angle each time is rotating the substrate at 90° each time.

In some embodiments, rotating the substrate Y times is rotating the substrate eight times and rotating the substrate at M angle each time is rotating the substrate at 45° each time.

In some embodiments, the ions are for extension implants.

In some embodiments, the ions include at least one of Boron fluoride ($BF_2$) and Arsenic ions ($As^+$).

In some embodiments, a dose concentration for the ions ranges from about $1E13/cm^2$ to $5E14/cm^2$.

In some embodiments, an energy used for implanting the ions ranges from about 2 KeV to 10 KeV In some embodiments, a tilting angle of the ions ranges from about 0° to 10°.

In some embodiments, the ions are for halo implants.

In some embodiments, the ions include at least one of Arsenic ions ($As^+$) and Boron ions($B^+$).

In some embodiments, a dose concentration for the ions ranges from about $1E13/cm^2$ to $5E14/cm^2$.

In some embodiments, an energy used for implanting the ions ranges from about 5 KeV to 50 KeV.

In some embodiments, a tilting angle of the ions ranges from about 0° to 20°.

In some embodiments, the substrate is rotated by rotating a chuck where the substrate is disposed on.

In some embodiments, the method further comprises rotating the chuck using a stepper motor mechanically coupled to a shaft of the chuck. A full rotation of the stepper motor is divided into a number of steps. The number of steps is dependent on the rotational displacement of the substrate.

Accordingly, another aspect of the instant disclosure provides an apparatus for implanting ions on a substrate having a first transistor and a second transistor orthogonally arranged from the first transistor. The apparatus comprises an ion source; a chuck positioned to face the ion source, the chuck having a plate where the substrate is disposed on and a shaft coupled to a center portion of the plate; an analyzer positioned to face the substrate and outputs a rotational displacement of the substrate; and a stepper motor mechanically coupled to the shaft of the chuck to rotate the substrate, a number of steps for the stepper motor to complete a full rotation is X when the rotational displacement is substantially 0 and Y when the rotational displacement is greater than 0.

In some embodiments, the number of steps for the stepper motor to complete a full rotation is four and each step rotates at a 90° angle when the rotational displacement is substantially 0.

In some embodiments, the number of steps for the stepper motor to complete a full rotation is eight and each step rotates at a 45° angle when the rotational displacement is greater than 0.

In some embodiments, the apparatus further comprises a controller coupled to the analyzer and the stepper motor, the controller outputs signals to the stepper motor according to an input from the analyzer, the input being the rotational displacement of the substrate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An implanting method, comprising:
   disposing a substrate on a chuck;
   analyzing the substrate to determine a rotational displacement of the substrate by an analyzer;
   implanting ions to the substrate;
   rotating the substrate X times and rotating the substrate at N angle each time when the rotational displacement is 0; and
   rotating the substrate Y times and rotating the substrate at M angle each time when the rotational displacement is greater than 0.

2. The method of claim 1, wherein the substrate has a first transistor and a second transistor orthogonally arranged with respect to the first transistor.

3. The method of claim 1, wherein rotating the substrate X times is rotating the substrate four times and rotating the substrate at N angle each time is rotating the substrate at 90° each time.

4. The method of claim 1, wherein rotating the substrate Y times is rotating the substrate eight times and rotating the substrate at M angle each time is rotating the substrate at 45° each time.

5. The method of claim 1, wherein the ions are for extension implants.

6. The method of claim 5, wherein the ions include at least one of Boron fluoride ($BF_2$) and Arsenic ions ($As^+$).

7. The method of claim 5, wherein a dose concentration for the ions ranges from about $1E13/cm^2$ to $5E14/cm^2$.

8. The method of claim 5, wherein an energy used for implanting the ions ranges from about 2KeV to 10KeV.

9. The method of claim 5, wherein a tilting angle of the ions ranges from about 0° to 10°.

10. The method of claim 1, wherein the ions are for halo implants.

11. The method of claim 10, wherein the ions include at least one of Arsenic ions ($As^+$) and Boron ions($B^+$).

12. The method of claim 10, wherein a dose concentration for the ions ranges from about $1E13/cm^2$ to $5E14/cm^2$.

13. The method of claim 10, wherein an energy used for implanting the ions ranges from about 5KeV to 50KeV.

14. The method of claim 10, wherein a tilting angle of the ions ranges from about 0° to 20°.

15. The method of claim 1, wherein the substrate is rotated by rotating a chuck where the substrate is disposed on.

16. The method of claim 15, further comprising:
    rotating the chuck using a stepper motor mechanically coupled to a shaft of the chuck, wherein a full rotation of the stepper motor is divided into a number of steps, the number of steps being dependent on the rotational displacement of the substrate.

* * * * *